Feb. 14, 1967 R. P. KOLB 3,304,207
THERMOELECTRIC GENERATOR
Filed May 16, 1963
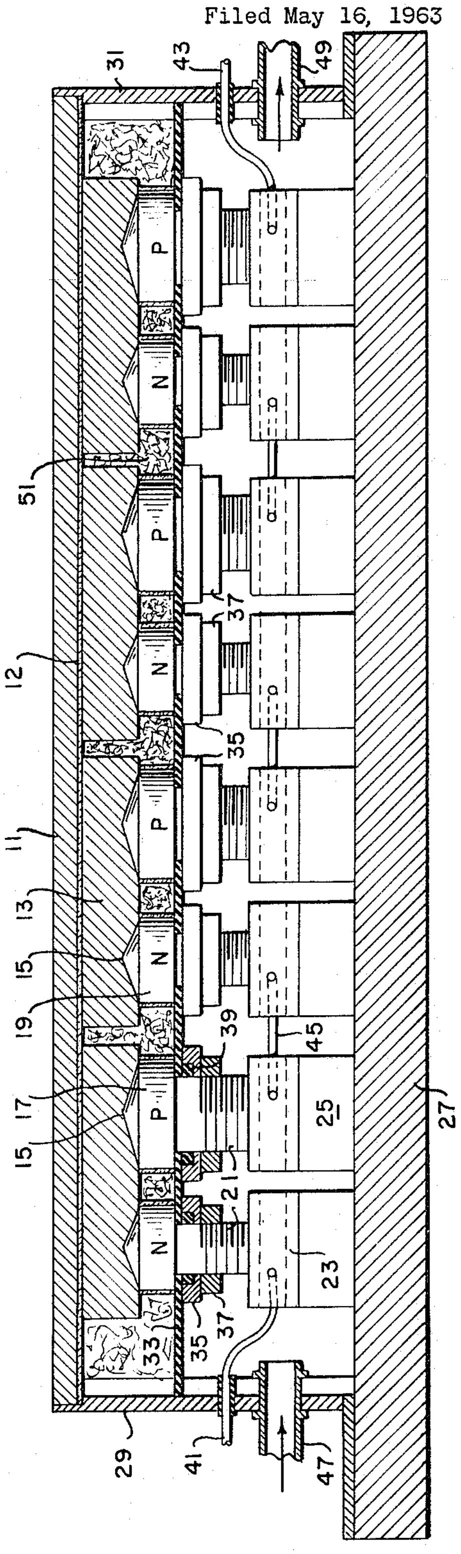
INVENTOR.
ROBERT P. KOLB
BY D. C. Hodges ATTY.
Howard W. Hermann AGENT

United States Patent Office 3,304,207
Patented Feb. 14, 1967

3,304,207

THERMOELECTRIC GENERATOR

Robert P. Kolb, Severna Park, Md., assignor to the United States of America as represented by the Secretary of the Navy Filed May 16, 1963, Ser. No. 281,072
8 Claims. (Cl. 136—211)

The invention described herein may be manufactured and used by or for the Government of the United States of America for governmental purposes without the payment of any royalties thereon or therefor.

The present invention relates to the field of thermoelectric apparatus and more particularly to methods and arrangements for mounting thermoelectric elements in such apparatus.

Various types of construction have heretofore been proposed for mounting thermoelectric elements in thermoelectric generators and other types of thermoelectric apparatus. The basic object in such devices is to provide maximum efficiency with a minimum danger of breakage or failure of the elements which comprise the device. In thermoelectric generators the temperature differential across the thermoelectric element from its hot junction to its cold junction determines the amount of electrical voltage which can be generated by the element. In order to obtain a worthwhile electrical output from the generator, it is common practice to provide a battery of electrically interconnected elements in such devices. In order to prevent short circuit, electrical insulation is necessary to separate elements from one another and from the casing in which they are mounted. Since most good electrical insulating materials are also good thermal insulators the provision of electrical insulation cuts down on the amount of heat transmitted to the thermoelectric elements, thereby decreasing the efficiency of the system.

Another problem inherent in the systems of this type is the need for allowing room for thermal expansion and contraction of elements of the generator. If sliding surfaces in contact are provided to allow for expansion any heat transmitted to the element must flow across an unbonded interface containing minute air spaces. Since air is also a poor thermal conductor the efficiency of the system is again reduced.

Although a number of improvements in this field have been proposed, the problems are still inherent to some extent in all thermoelectric devices.

Accordingly, it is an object of this invention to provide an improved thermoelectric generator construction by producing a minimum temperature difference between the cooled ends of the semiconductor elements and the cooling medium to thereby make possible the development of optimum electromotive force by each of the thermoelectric couples in the generator.

A further object is the provision of a thermoelectric generator construction which provides a lightweight and compact means for protecting the elements against fracture resulting from stresses caused by unequal expansion and contraction of the component parts of the generator.

Another object of this invention is to provide a thermoelectric generator construction which minimizes the need for layers of electrical insulation as component parts of the generator structure.

A still further object is to eliminate in the thermoelectric generators the necessity for a layer of spacer material to maintain the proper position of adjacent thermoelectric couples with respect to one another.

Other objects and many of the attendant advantages of this invention will be readily appreciated as the same becomes better understood by reference to the following detailed description when considered in connection with the accompanying drawings wherein:

The sole figure is an elevational view partly in cross-section of an embodiment of this invention.

Referring now to the drawings, there is shown in the figure a heated face 11, which may, for example in a practical application, be an engine exhaust pipe carrying hot exhaust gases. Mounted in contact with the heated face 11, but electrically insulated therefrom by means of a ceramic coating 12, a layer of mica, or the like, are a plurality of hot shoes 13 each having machined therein a pair of conical holes 15 into which are placed a pair of alternately positive and negative thermoelectric elements 17, 19 of semiconductor material. The thermoelectric elements 17, 19 each have conical surfaces which fit into the holes 15 in order to hold them in position.

Connected to each of the thermoelectric elements 17, 19 preferably by soldering to the base thereof is a threaded stub 21 of copper or the like which in turn is connected, again preferably by soldering, to a rectangular tube 23 which is made of electrically and thermally conductive material such as copper or an alloy thereof. Blocks 25 of electrically insulating resilient material such as rubber are placed in contact with the tubes 23 on the sides opposite the stubs 21. These blocks are held in compression by a base plate 27. Walls 29, 31 are provided to interconnect and complete the structure between the base plate 27 and the heated face 11.

The chamber of the thermoelectric generator module formed by the heated face 11, walls 29 and 31, and base plate 27 is divided into two parts by means of a flexible fluid-tight, electrically insulating diaphragm 33. Holes are provided in the diaphragm for the passage therethrough of the stubs 21 and the diaphragm is bonded by means of a suitable adhesive or by mechanical confinement to the walls 29 and 31 which may be provided with slots for mounting the diaphragm.

The diaphragm is preferably made of synthetic rubber having suitable characteristics of flexibility, electrical resistance, resistance to heat, and capability of rendering good service in contact with petroleum oils. A material which has been found satisfactory for this purpose is acrylonitrile copolymer rubber having the chemical name nitrile butadiene.

The diaphragm 33 is held in place at each of the thermoelectric elements 17, 19 by means of a gland ring 35 which is forced into contact with the diaphragm and held thereby a gland nut 37 threaded on the stud 21. If desired, an O-ring seal 39 may be provided in the gland ring 35 to insure a fluid-tight connection between the gland and the diaphragm.

Electrical connections to the module are made by means of leads 41 and 43 which pass through the walls of the module and are connected to the first and last rectangular tubes 23. Connections between the thermoelectric elements 17, 19 of each pair are made through the hot shoes 13 and the pairs of elements are interconnected by means of electrical cables 45 which are soldered to the rectangular tubes 23.

Cooling fluid enters the cooling chamber through an inlet tube 47 and leaves through an outlet tube 49. The cooling fluid is preferably a dielectric oil although other materials may be used. It must be noted, however, that the coolant used must not be electrically conductive.

The space 51 between the thermoelectric elements is preferably filled with packed fibrous thermal insulation to prevent thermal flow from the heated face to the diaphragm between the thermoelectric elements.

Thus there has been described a novel arrangement for a thermoelectric generator. The combined components including the stub, gland ring, gland nut, and rectangular tube, together with the soldered connection between the stub and the thermoelectric element, form a short, direct and completely metallic path free from unbonded surface contacts for the flow of rejected heat from the elements to the cooling medium. Thus, the overall temperature difference between the semiconductor elements and the coolant is minimized. The rubber diaphragm protects the semiconductor elements against fracture due to module expansion and contraction stresses, thus permitting the use of a rigid, fully metallic heat sink assembly. Together with the dielectric coolant, it provides the only electrical insulation necessary on the heat sink of the module. It also provides a fluid-tight seal at each copper stub between the two compartments of the module and through the use of properly spaced and sized holes it enables the element sink assemblies to be held in correct alignment with one another.

Obviously, many modifications and variations of the present invention are possible in the light of the above teachings. It is therefore to be understood that within the scope of the appended claims the invention may be practiced otherwise than as specifically described.

What is claimed is:

1. A thermoelectric generator comprising a heated face;
a plurality of thermoelectric elements adapted to receive heat from said heated face;
a plurality of walls, said walls and said heated face forming a chamber;
cooling means in said chamber for carrying heat away from said thermoelectric elements;
a single flexible, electrically insulating diaphragm interposed between said thermoelectric elements and said cooling means; said diaphragm being spaced from said heated face;
said cooling means including means providing a metallic path extending from each of said thermoelectric elements, said metallic path means being immersed in a cooling fluid;
said diaphragm forming a fluid-tight seal across said chamber to prevent said cooling fluid from contacting said thermoelectric elements;
holes provided in said diaphragm for passage of said metallic path means therethrough;
each of said metallic path means including a threaded stub electrically connected to one of said thermoelectric elements;
a gland ring on said stub; and
a gland nut threaded on said stub for forcing said gland ring into contact with said diaphragm to form a fluid-tight seal around each of said holes.

2. A thermoelectric generator as defined in claim 1 wherein:
resilient means are provided between said metallic path means and a wall of said chamber for resiliently biasing said thermoelectric elements and said metallic paths in position.

3. A thermoelectric generator as defined in claim 2 wherein:
each of said metallic path means further includes a rectangular metallic tube electrically connected to said stub, said rectangular tube being in physical contact with said resilient means.

4. A thermoelectric generator as defined in claim 3 wherein:
electrical connections are made from said rectangular metallic tubes.

5. A thermoelectric generator as defined in claim 4 wherein:
a metallic hot shoe is provided for each pair of thermoelectric elements, said shoe being placed between said thermoelectric elements and said heated face.

6. A thermoelectric generator as defined in claim 5 wherein:
said shoe has a pair of conical holes therein; and
said thermoelectric elements have conical shaped portions which fit into said holes in said shoes.

7. A thermoelectric generator as defined in claim 2 wherein:
a metallic shoe is provided for each pair of thermoelectric elements, said shoe being placed between said thermoelectric elements and said heated face.

8. A thermoelectric generator as defined in claim 7 wherein:
said shoe has a pair of conical holes therein; and
said thermoelectric elements have conical shaped portions which fit into said holes in said shoes.

References Cited by the Examiner

UNITED STATES PATENTS

| | | | |
|---|---|---|---|
| 1,848,655 | 3/1932 | Petrik | 136—4.2 |
| 2,870,610 | 1/1959 | Lindenblad | 136—4.2 |
| 3,197,343 | 7/1965 | Palmatier | 62—3 |
| 3,208,877 | 9/1965 | Merry | 136—5 X |

WINSTON A. DOUGLAS, *Primary Examiner.*

ALLEN B. CURTIS, *Examiner.*